(12) United States Patent
Tomar et al.

(10) Patent No.: US 8,028,262 B2
(45) Date of Patent: Sep. 27, 2011

(54) MAPPING PROGRAMMABLE LOGIC DEVICES

(75) Inventors: Ajay Tomar, Ghaziabad (IN); Dhabalendu Samanta, Delhi (IN)

(73) Assignee: Sicronic Remote KG, LLC, Wilmington, DE (US)

( * ) Notice: Subject to any disclaimer, the term of this patent is extended or adjusted under 35 U.S.C. 154(b) by 634 days.

(21) Appl. No.: 12/117,656

(22) Filed: May 8, 2008

(65) Prior Publication Data
US 2008/0209385 A1 Aug. 28, 2008

Related U.S. Application Data

(62) Division of application No. 11/025,785, filed on Dec. 29, 2004, now Pat. No. 7,415,681.

(30) Foreign Application Priority Data

Dec. 29, 2003 (IN) .......................... 1639/DEL/2003

(51) Int. Cl.
*G06F 17/50* (2006.01)
(52) U.S. Cl. ...................................................... 716/116
(58) Field of Classification Search .................. 716/2, 5, 716/16, 116
See application file for complete search history.

(56) References Cited

U.S. PATENT DOCUMENTS

| | | | |
|---|---|---|---|
| 6,336,208 | B1 | 1/2002 | Mohan et al. |
| 7,415,681 | B2 | 8/2008 | Tomar et al. |
| 7,594,208 | B1 * | 9/2009 | Borer et al. ........................ 716/5 |
| 2004/0133869 | A1 | 7/2004 | Sharma |

OTHER PUBLICATIONS

Chen, Kuang-Chien et al., "DAG Map: Graph-Based FPGA Technology Mapping for Delay Optimization", *IEEE Design and Test of Computers*, vol. 9, Issue 3, Available at <http://ballade.cs.ucla.edu/~cong/papers/ieeedt92.pdf>,(Sep. 1992), pp. 7-20.

Long, Jason et al., "On Area/Depth Trade-off in LUT-Based FPGA Technology Mapping", *30th ACM/IEEE Design Automation Conference (DAC)*, (1993), pp. 213-218.

Francis, Robert J., et al., "Technology Mapping of Lookup Table-Based FPGA's for Performance", *International Conference on CAD*, (Feb. 1991), pp. 568-571.

"Complexity of the Lookup-Table Minimization Problem for FPGA Technology Mapping", *IEEE Transactions on CAD of ICs and Systems* vol. 13 No. 11, (Nov. 1994), pp. 1319-1332.

Bhardwaj, Sarvesh et al., "Timing Analysis Under Uncertainty", *Proceedings of the International Conference on Computer Aided Design*, Available at <http://portal.acm.org/citation.cfm?id=996070.1009953>, (2003), pp. 615-620.

Lim, Sung K., "Partitioning and Placement for Buildable QCA Circuits", *ACM Journal on Emerging Technologies in Computing Systems*, vol. 1, No. 1, (Apr. 2005), pp. 50-72.

Francis, et al., "A Technology Mapping Program for Lookup Table-Based Field Programmable Gate Arrays", *Proceedings, 27th ACM/IEEE Design Automation Conference*, (Jun. 1990), pp. 613-619.

Chen, et al., "DAG Map: Graph Based FPGA Technology Mapping for Delay Optimization:", *IEEE Design and test of computers*, (Sep. 1992),pp. 7-20.

(Continued)

*Primary Examiner* — Suresh Memula

(57) ABSTRACT

Methods and systems improve mapping of LUT based FPGAs. In some embodiments, a topological sort is performed on a network to be mapped, whereby the network is represented as a Directed Acyclic Graph. The system locates feasible reconvergent paths existing from transitive fan-ins of individual nodes using a Reconvergent Path Locator for replicating fan-outs of the nodes in the DAG, and therefore improves the number of LUTs and the time consumed in the mapping process.

20 Claims, 3 Drawing Sheets

OTHER PUBLICATIONS

Long, Jason et al., "On Area/Depth Trade-off in LUT-Based FPGA Technology Mapping", *30th ACM/IEEE design Automation Conference (DAC)*, (1993),pp. 213-218.

Francis, R J., et al., "Technology Mapping of Lookup Table-Based FPGA's for Performance", *International conference on CAD*, (Feb. 1991),pp. 568-571.

Farrahi, et al., "Complexity of the Lookup-Table Minimization Problem for FPGA Technology Mapping", *IEEE Transactions on CAD of ICs and Systems vol. 13 No. 11*, (Nov. 1994),pp. 1319-1332.

Bhardwaj, Sarvesh "Timing Analysis Under Uncertainty", *Proceedings of the International Conference on Computer Aided Design*, (2003),pp. 615-620.

Lim, "Partitioning and Placement for Buildable QCA Circuits", *ACM Journal on Emerging Technologies in Computing Systems*, vol. 1 No. 1,(Apr. 2005),pp. 50-72.

Francis, et al., "A Technology Mapping Program for Lookup Table-Based Field Programmable Gate Arrays", Proceedings, *27th ACM/IEEE Design Automation Conference*, (Jun. 1990),pp. 613-619.

* cited by examiner

MAPPING PROGRAMMABLE LOGIC DEVICES

RELATED APPLICATION

This application is a divisional of and claims priority to U.S. patent application Ser. No. 11/025,785, filed on Dec. 29, 2004, which in turn claims priority to Indian Patent Application No. 1639/DEL/2003, filed on Dec. 29, 2003, the disclosures of which are incorporated by reference herein.

BACKGROUND

A programmable logic array device has a plurality of logic elements and an interconnect structure for conveying signals between logic elements. In LUT (Look Up Table) based FPGA's (Field Programmable Gate Arrays), mapping is done prior to the placement and routing of the design in an FPGA. The objective of LUT mapping is to reduce the area/depth of the mapped solution.

In LUT based FPGA's, optimal mapping of gates into LUT's is done while ensuring that the number of transitive fan-ins to sink is always less than or equal to the number of LUT inputs. FIG. 1 illustrates the mapping process as a part of the FPGA development flow. 1.1 in the figure indicates the Gate Level Netlist as an input to the Optimizer Block that outputs Optimized Gate Level Netlist 1.2. The optimized netlist is then Mapped into LUT as shown in the 1.3 that is followed by Packing LUT's in to Programmable Logic Blocks (PLB's) 1.4. Then the design is simulated for Placement and Routing 1.5, 1.6. The bit stream is generated as in the Configuration Bits of the Design block 1.7. The bit stream is then downloaded in the FPGA to configure the FPGA as shown in the block 1.8.

FIG. 2 illustrates a legacy Mapping process in LUT based FPGA's. 2.1 is Directed Acyclic Graph (DAG) that represents the mapping data as nodes, wherein the nodes in the DAG simulate the LUT's in the FPGA. 2.1 also illustrates initialization of the inputs to the LUT's (k) and the initialization of the fan-out factor. Block 2.2 illustrates performing a topological sort on the DAG. Block 2.3 illustrates the Computation of the Dependency variable for each node in the graph, whereby the dependency is computed keeping in view that the nodes are analyzed for their respective inputs and outputs. Block 2.4 performs check on the Dependency Variable till it is greater than the variable k. Block 2.5 shows the computation of the Priority Variable (Fc) for all the children of the node under consideration, and performing the same function for all other nodes in the Directed Acyclic Graph. Priority Variable (Fc) is a function of the following:

Contribution Variable (Zc), where c in the suffix denotes the children of the node;

Number of fan-outs (Oc) for the children of the node under consideration; and

Fan-out Factor (FF) variable.

Block 2.6 sorts the list of the children of the node under consideration in the descending order of their priority values followed by block 2.7 that assigns LUT's to the children of the node under consideration until the dependency variable is less than k plus one.

Block 2.8 assigns a LUT to each output of a given node that has been left unassigned.

The computations for the Contribution Variable, Dependency variable, and the Priority Function is as shown below:

Let a given design be represented by a directed acyclic graph (DAG) G(V, E) where each vertex v in V represents a Boolean function and each directed edge (v, u) represents a connection between the output of v and the input of u.

Let VI denote the set of nodes for which LUT is assigned. That is, VI={v∈V:a LUT is assigned to v}.

Contribution Zv:
For each PI v, Zv=1,
For each v∈VI, Zv=1,
For all the other vertices v∈V, $Z_v = Z_{u1} + Z_{u2} + \ldots + Z_1$
where u1, u2, . . . , u1 are all the children of v.

Dependency dv:
a) For each PI v, dv=1
For all other vertices v∈V, $dv = Z_{u1} + Z_{u2} + \ldots + Z_1$ where u1, u2, . . . , u1 are all the children of v.

Priority Function Fv:

$$Fv = F(Zv, Ov, FF) = Zv + FF * Ov$$

Where Ov is the number fan outs of v and FF is a suitable fan out factor.

The legacy Level Map method does not take into account of reconvergent paths and fan-out replication effectively, therefore it is essential to provide a system for optimizing design area in FPGA by exploring reconvergent paths in conjunction with fan-out replication in LUT mapping.

DETAILED DESCRIPTION

Figure 1:
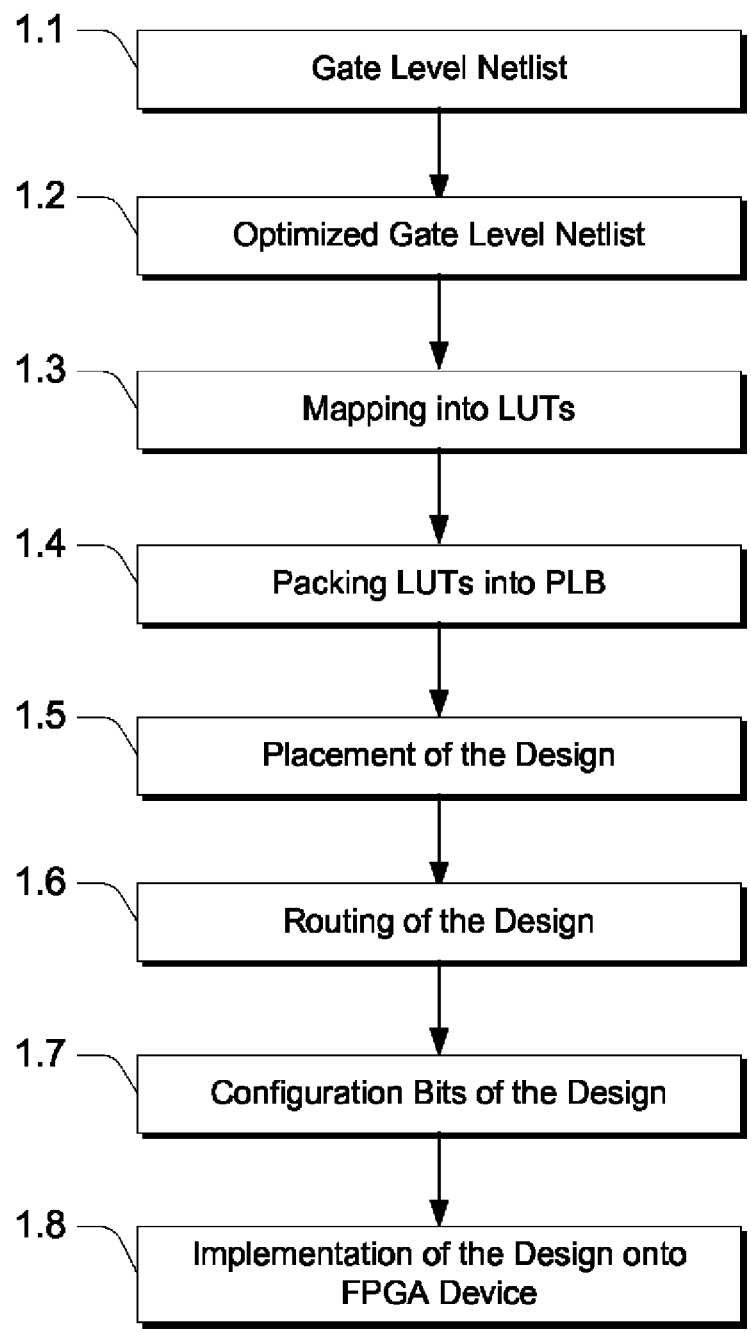
FIG. 1 illustrates an FPGA development flow and a process of mapping in it.

In one embodiment, a system for improved optimal mapping of LUT based FPGAs is provided that comprises:

a Directed Acyclic Graph (DAG) representation of the network to be mapped, a sorter that operates on said DAG to reduce its complexity, a Dependency Definer that determines the dependency of each node in the DAG, a Reconvergent Path Locator (RPL) that determines feasible reconvergent paths from transitive fan-ins of each said node, a Priority Determiner (PD) that determines the priority of all the child nodes of each said node, a Node Sorter (NS) that sorts the list of child nodes in descending order of priority, a Mapper (M) that assigns LUT's to the child nodes from the beginning of said sorted list until the node dependency is less than one plus the number of LUTs, an Assignor (A) that assigns an LUT to each output of a particular node.

In some embodiments, said sorter is a topological sorter.
In some embodiments, said Node Sorter is a Child node sorter.
In some embodiments, said Mapper is a LUT Mapper.
In some embodiments, said Assignor is a LUT assignor.

A method is discussed for optimal mapping of LUT based FPGA's, the method comprising:

generating a Directed Acyclic Graph (DAG) representation of the network to be mapped, sorting the network in the DAG to reduce the complexity of the network, determining dependency of each node in the DAG, locating feasible reconvergent paths existing from transitive fan-ins of each node, determining the priority of all the child nodes of each node, sorting the child nodes in the descending order of their priority, assigning LUTs to the child nodes until the node dependency is less than one plus the number of LUTs, and assigning an LUT to each output of the nodes in the DAG representation.

In some embodiments, said sorting is topologically sorting the network in the DAG.

In some embodiments, said dependency is determined by considering the inputs and outputs of each node.

In some embodiments, said feasible reconvergent paths are selected to be equal to said number of inputs to one LUT.

In some embodiments, said determining the priority is generating the priority for the child nodes based on the fan-outs of the nodes in said DAG.

In some embodiments, said assigning an LUT is forming LUT for a node after performing a check on the number of fan-outs for said node and dependency of the node.

In some embodiments, said forming LUT is assigning LUTs to all unassigned nodes.

Some embodiments include a computer program product that comprises computer readable program code stored on a computer readable storage medium embodied therein for providing a system for optimal mapping of LUT based FPGA's, the system comprising:

a Directed Acyclic Graph (DAG) representation of the network to be mapped, a sorter that operates on said DAG to reduce its complexity, a Dependency Definer that determines the dependency of each node in the DAG, a Reconvergent Path Locator (RPL) that determines feasible reconvergent paths from transitive fan-ins of each said node, a Priority Determiner (PD) that determines the priority of all the child nodes of each said node, a Node Sorter (NS) that sorts the list of child nodes in descending order of priority, a Mapper (M) that assigns LUT's to the child nodes from the beginning of said sorted list until the node dependency is less than one plus the number of LUTs, an Assignor (A) that assigns an LUT to each output of a particular node.

In some embodiments, the sorter is a topological sorter.

In some embodiments, the Node Sorter is a Child node sorter.

In some embodiments, the Mapper is a LUT Mapper.

In some embodiments, the assignor is a LUT assignor.

Some embodiments provide optimized mapping for LUT based FPGA's and reduce the design area, with optimized mapping speed.

Figure 2:
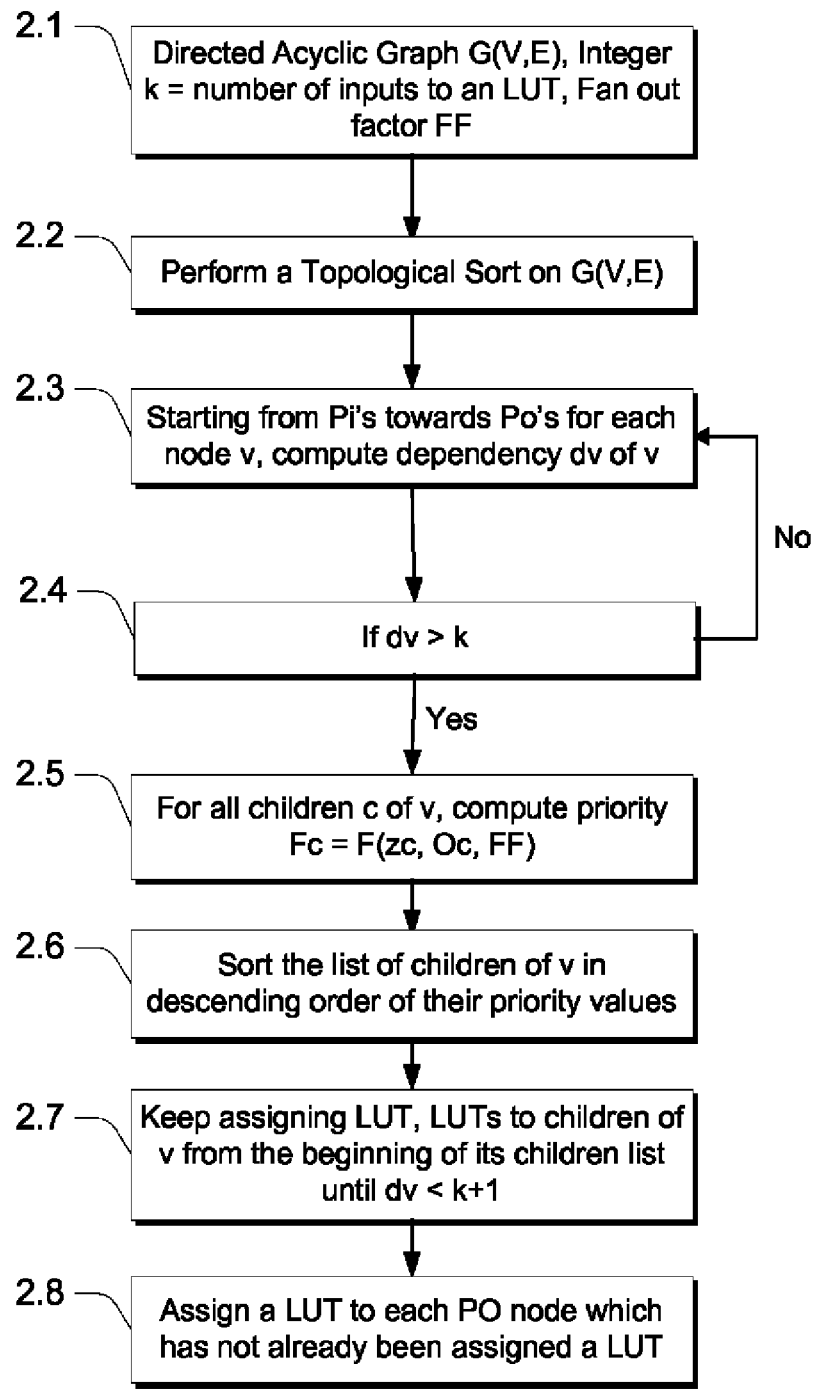
FIG. 2 illustrates a flow diagram of a legacy mapping process.

FIG. 1 and FIG. 2 depicting the FPGA development flow and legacy mapping process respectively have been described in the background section, above.

Figure 3:
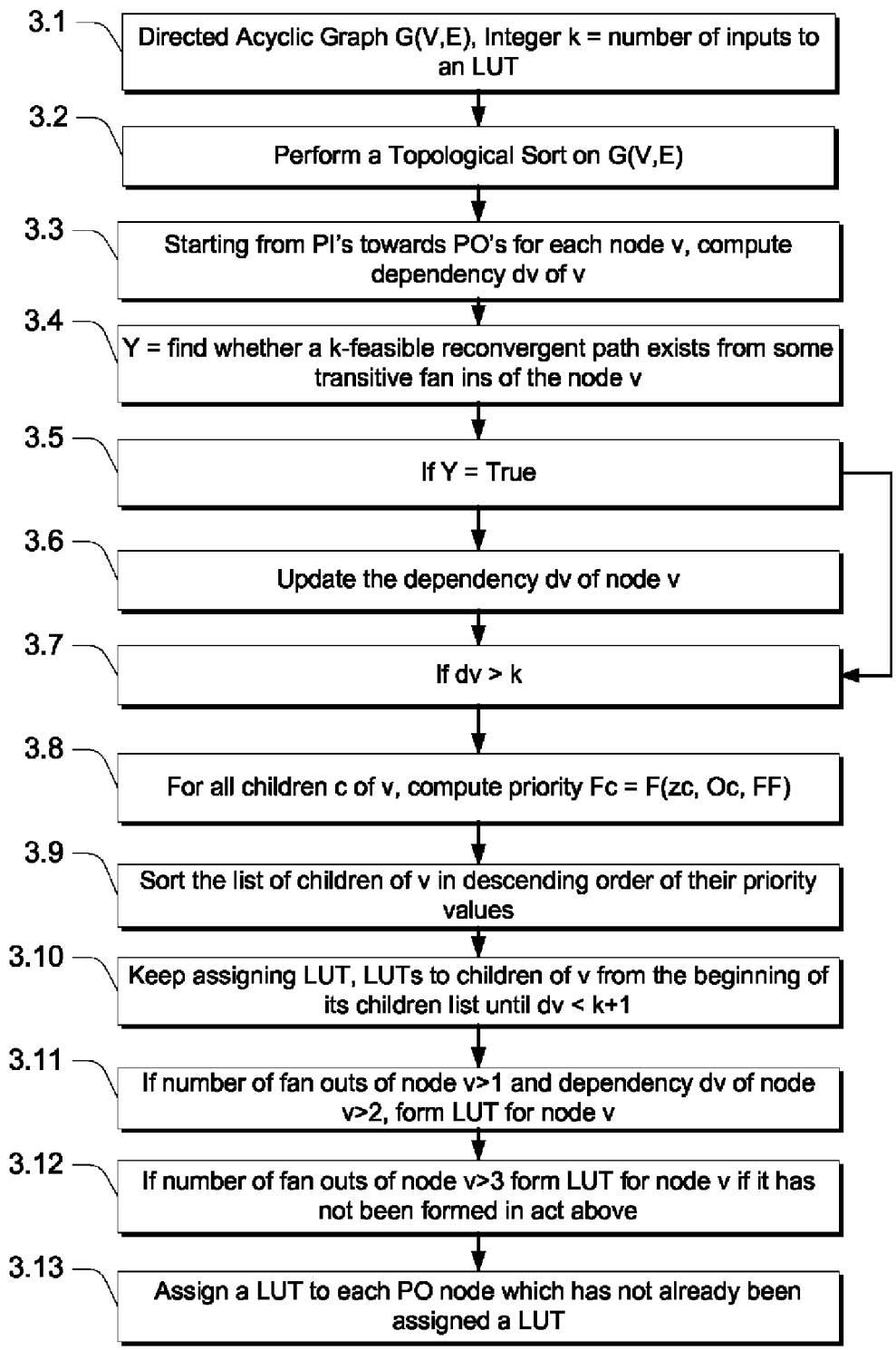
FIG. 3 illustrates a flow diagram of a system according to one or more embodiments.

FIG. 3 shows a flow diagram of one embodiment that incorporates exploration of the reconvergent paths in conjunction with fan-out replication. Block 3.1 initiates the Directed Acyclic Graph (DAG) representation of the data to be mapped and the number of inputs to the LUT is initialized (k). Block 3.2 illustrates performing a topological sort on the given DAG. Block 3.3 illustrates the Computation of the Dependency variable (dv) for each node (v) in the graph, whereby the dependency is computed keeping in view that the nodes are analyzed for their respective inputs and outputs. Block 3.4 searches for feasible reconvergent paths from transitive fan-ins of a particular node under consideration. The reconvergent paths are desirable to be equal to k. The Dependency of the node under consideration is updated until the dependency variable is greater than k in Blocks 3.5, 3.6 and 3.7. Block 3.8 shows the computation of the Priority Variable (Fc) for the children of the node under consideration, and performing the same function for all other nodes in the Directed Acyclic Graph. Priority Variable (Fc) is a function of the following:

Contribution Variable (Zc), where c in the suffix denotes the children of the node.

Number of fan-outs (Oc) for the children of the node under consideration.

Fan-out Factor (FF) variable.

Block 3.9 sorts the list of the children of the node under consideration in the descending order of their priority values followed by block 3.10 that assigns LUT's to the children of the node under consideration until the dependency variable is less than k plus one. Block 3.11 checks whether the number of fan-outs of node is greater than one and the Dependency variable dv of the node is greater than 2, then form a LUT for the given node under consideration followed by formation of LUT if the number of fan-outs is greater than three as in Block 3.12. Here an LUT is formed, if it has not been formed in the Block 3.11. Block 3.13 assigns a LUT to each output of a given node that has been left unassigned.

It can be observed from the following table that the reduction in the number of LUTs by the proposed method is substantial as compared to any increase in the execution time for the mapping process.

Results of few benchmark circuits for LUTs formation are tabulated.

| Design | No. of LUTs by Proposed Technique | No. of LUTs by LevelMap | No. of LUTs by FlowMap | Execution Time for Proposed Tech. (seconds) | Execution Time for LevelMap (seconds) |
| --- | --- | --- | --- | --- | --- |
| alu2 | 265 | 272 | 421 | 0.46 | 0.4 |
| alu4 | 1646 | 1756 | 2080 | 3.5 | 3.4 |
| apex2 | 2117 | 2274 | 2511 | 4.5 | 4.2 |
| apex3 | 818 | 867 | 1010 | 1.2 | 1.1 |
| duke2 | 263 | 270 | 327 | .42 | 0.4 |
| Misex3 | 2265 | 2393 | 2661 | 6.9 | 6.7 |
| Rd73 | 170 | 184 | 263 | 0.4 | 0.3 |
| Rd84 | 391 | 402 | 481 | 1.6 | 1.5 |
| clma_mod | 7452 | 9344 | 9248 | 47.5 | 46.35 |

-continued

| Design | No. of LUTs by Proposed Technique | No. of LUTs by LevelMap | No. of LUTs by FlowMap | Execution Time for Proposed Tech. (seconds) | Execution Time for LevelMap (seconds) |
|---|---|---|---|---|---|
| fft16_mod | 15947 | 19334 | 18215 | 78.1 | 77 |
| Cordic | 800 | 1117 | 907 | 2.1 | 1.9 |
| Dalu | 603 | 875 | 824 | 3 | 2.9 |
| Total | 32737 | 39088 | 38948 | 149.68 | 146.15 |

Reductions in LUTs count (w.r.t. LevelMap) is 16.25%.
Increase in Execution time is 2%.

By exploring the reconvergent paths in conjunction with fan-out replication, the certain embodiments map a design with a substantially reduced number of LUTs with minimal increment in execution time.

The invention claimed is:

1. A method for mapping look-up table (LUT) based field programmable gate arrays (FPGAs), the method comprising:
representing a network to be mapped using a Directed Acyclic Graph (DAG), the DAG including a plurality of nodes v;
traversing individual nodes v in the DAG;
computing a dependency variable dv for individual traversed nodes v using an input and output of the traversed node v;
assigning a LUT to a traversed node v if at least one of the following conditions is satisfied:
if its dv>k, with k representing a number of LUT inputs;
if its dv>1 and a number of fanouts from that traversed node v is >2; or
if a number of fanouts from that traversed node v is >3; and
configuring an FPGA using an assigned LUT.

2. The method as recited in claim 1, wherein the assigning if the dv>k condition is satisfied comprises:
identifying child nodes c from the traversed node v;
prioritizing the child nodes; and
assigning a LUT to the child note c of traversed node v unless its dv<k+1.

3. The method as recited in claim 2, wherein the prioritizing comprises generating a priority for the child nodes based at least in part on the fan-outs of the nodes of the DAG.

4. The method as recited in claim 1, wherein computing a dependency variable dv for individual traversed nodes v comprises:
determining whether k reconvergent paths exist from transitive fan-ins of the traversed node v; and
if so, updating the dv of that node v to account for the determined reconvergent paths.

5. The method as recited in claim 1, wherein assigning a LUT to a traversed node v is performed after all nodes v have been traversed and the dependency variable dv has been computed for each traversed node v.

6. A method for mapping of look-up table (LUT) based field programmable gate arrays (FPGAs), the method comprising:
representing a network to be mapped using a Directed Acyclic Graph (DAG), the DAG including a plurality of nodes v;
traversing individual nodes v in the DAG;
computing a dependency variable dv for individual traversed nodes v using an input and output of the traversed node v;
identifying nodes whose dependency variable dv is >k, with k representing a number of LUT inputs;
assigning to each identified node a LUT if either of the following conditions is satisfied:
if its dv>1 and a number of fanouts from that identified node is >2; or
if a number of fanouts from that identified node is >3; and
configuring an FPGA using an assigned LUT.

7. The method as recited in claim 6, wherein the representing comprises topologically sorting the network in the DAG.

8. The method as recited in claim 6, wherein computing a dependency variable dv for individual traversed nodes v comprises:
determining whether k reconvergent paths exist from transitive fan-ins of the traversed node v; and
if so, updating the dv of that node v to account for the determined reconvergent paths.

9. The method as recited in claim 6, wherein the assigning comprises:
identifying child nodes c from the traversed node v;
prioritizing the child nodes; and
assigning a LUT to the child node c of traversed node v unless its dv<k+1.

10. The method as recited in claim 6, wherein assigning a LUT to a traversed node v is performed after all nodes v have been traversed and the dependency variable dv has been computed for each traversed node v.

11. One or more non-transitory computer-readable storage media having computer-readable instructions thereon which, when executed by a computer, implement a method for mapping look-up table (LUT) based field programmable gate arrays (FPGAs), the method comprising:
representing a network to be mapped using a Directed Acyclic Graph (DAG), the DAG including a plurality of nodes v;
traversing individual nodes v in the DAG;
computing a dependency variable dv for individual traversed nodes v using an input and output of the traversed node v; and
assigning a LUT to a traversed node v if at least one of the following conditions is satisfied:
if its dv>k, with k representing a number of LUT inputs;
if its dv>1 and a number of fanouts from that traversed node v is >2; or
if a number of fanouts from that traversed node v is >3.

12. One or more non-transitory computer-readable storage media as recited in claim 11, wherein the assigning if the dv>k condition is satisfied comprises:
identifying child nodes c from the traversed node v;
prioritizing the child nodes; and
assigning a LUT to the child node c of traversed node v unless its dv<k+1.

13. One or more non-transitory computer-readable storage media as recited in claim 12, wherein the prioritizing comprises generating a priority for the child nodes based at least in part on the fan-outs of the nodes of the DAG.

14. One or more non-transitory computer-readable storage media as recited in claim 11, wherein computing a dependency variable dv for individual traversed nodes v comprises:
   determining whether k reconvergent paths exist from transitive fan-ins of the traversed node v; and
   if so, updating the dv of that node v to account for the determined reconvergent paths.

15. One or more non-transitory computer-readable storage media as recited in claim 11, wherein assigning a LUT to a traversed node v is performed after all nodes v have been traversed and the dependency variable dv has been computed for each traversed node v.

16. One or more non-transitory computer-readable storage media having computer-readable instructions thereon which, when executed by a computer, implement operations for mapping look-up table (LUT) based field programmable gate arrays (FPGAs), the operations comprising:
   representing a network to be mapped usin Directed Acyclic Graph (DAG), the DAG including a plurality of nodes v;
   traversing individual nodes v in the DAG;
   computing a dependency variable dv for individual traversed nodes v using an input and output of the traversed node v;
   identifying nodes whose dependency variable dv is >k, with k representing a number of LUT inputs; and
   assigning to each identified node a LUT if either of the following conditions is satisfied;
      if its dv>1 and a number of fanouts from that identified node is >2; or
      if a number of fanouts from that identified node is >3.

17. One or more non-transitory computer-readable storage media as recited in claim 16, wherein the representing comprises topologically sorting the network in the DAG.

18. One or more non-transitory computer-readable storage media as recited in claim 16, wherein computing the dependency variable dv for individual traversed nodes v comprises:
   determining whether k reconvergent paths exist from transitive fan-ins of the traversed node v; and
   if so, updating the dv of that node v to account for the determined reconvergent paths.

19. One or more non-transitory computer-readable storage media as recited in claim 16, wherein the assigning comprises:
   identifying child nodes c from the traversed node v;
   prioritizing the child nodes; and
   assigning a LUT to the child node c of traversed node v unless its dv<k+1.

20. One or more non-transitory computer-readable storage media as recited in claim 16, wherein assigning a LUT to a traversed node v is performed after nodes v have been traversed and the dependency variable dv has been computed for each traversed node v.

* * * * *

UNITED STATES PATENT AND TRADEMARK OFFICE
CERTIFICATE OF CORRECTION

PATENT NO.        : 8,028,262 B2                                    Page 1 of 1
APPLICATION NO.   : 12/117656
DATED             : September 27, 2011
INVENTOR(S)       : Tomar et al.

It is certified that error appears in the above-identified patent and that said Letters Patent is hereby corrected as shown below:

Title Page, item (56), under "Other Publications", in Column 2, line 11, delete ""Complexity" and insert -- Farrahi, Amir H., et al., "Complexity --.

Column 5, line 42, in Claim 2, delete "note" and insert -- node --.

Column 7, line 21, in Claim 16, delete "usin" and insert -- using a --.

Signed and Sealed this
Fifteenth Day of May, 2012

David J. Kappos
*Director of the United States Patent and Trademark Office*